United States Patent [19]

Bachrach

[11] Patent Number: 5,957,648
[45] Date of Patent: Sep. 28, 1999

[54] FACTORY AUTOMATION APPARATUS AND METHOD FOR HANDLING, MOVING AND STORING SEMICONDUCTOR WAFER CARRIERS

[75] Inventor: Robert Z. Bachrach, Palo Alto, Calif.

[73] Assignee: Applied Materials, Inc., Santa Clara, Calif.

[21] Appl. No.: 08/764,661

[22] Filed: Dec. 11, 1996

[51] Int. Cl.⁶ ....................................................... B65G 1/12
[52] U.S. Cl. ........................... 414/217; 118/719; 414/331; 414/940; 414/939; 414/222; 414/236
[58] Field of Search ............................. 118/719; 414/940, 414/935, 937, 938, 331, 939, 217, 416, 417, 236, 237, 222

[56] References Cited

U.S. PATENT DOCUMENTS

| | | |
|---|---|---|
| 3,610,445 | 10/1971 | Kitchen et al. . |
| 4,047,624 | 9/1977 | Dorenbos ............................. 414/939 X |
| 4,615,430 | 10/1986 | Satoh .................................. 414/237 X |
| 4,781,511 | 11/1988 | Harada et al. . |
| 4,793,262 | 12/1988 | Horn . |
| 4,826,360 | 5/1989 | Iwasawa et al. ...................... 414/940 X |
| 4,851,018 | 7/1989 | Lazzari et al. ....................... 414/940 X |
| 4,904,153 | 2/1990 | Iwasawa et al. . |
| 4,986,715 | 1/1991 | Asakawa . |
| 5,048,164 | 9/1991 | Harima . |
| 5,363,867 | 11/1994 | Kawano et al. . |
| 5,391,035 | 2/1995 | Krueger . |
| 5,399,531 | 3/1995 | Wu ...................................... 414/940 X |
| 5,425,611 | 6/1995 | Hughes et al. ....................... 414/940 X |
| 5,462,397 | 10/1995 | Iwabuchi . |
| 5,464,313 | 11/1995 | Ohsawa . |
| 5,527,390 | 6/1996 | Ono et al. . |
| 5,562,383 | 10/1996 | Iwai et al. . |
| 5,570,990 | 11/1996 | Bonora et al. . |
| 5,586,585 | 12/1996 | Bonora et al. . |
| 5,628,604 | 5/1997 | Murata et al. . |
| 5,655,869 | 8/1997 | Scheler et al. . |
| 5,788,448 | 8/1998 | Wakamori et al. .................. 414/940 X |

FOREIGN PATENT DOCUMENTS

| | | | |
|---|---|---|---|
| 17006 | 1/1993 | Japan ...................................... 414/940 |
| 132186 | 5/1994 | Japan ...................................... 414/940 |

OTHER PUBLICATIONS

"Infab Universal Load Ports" 1995 Infab.
"Erect–A–Line"® Middlesex Industries.

*Primary Examiner*—Frank E. Werner
*Attorney, Agent, or Firm*—Dugan & Dugan

[57] ABSTRACT

An improved apparatus and method is provided for handling, moving and storing semiconductor wafer carriers. The apparatus comprises two physically separate load ports, each coupled to a vertical transfer mechanism. Coupled between the two vertical transfer mechanisms is a horizontal transfer mechanism which extends above the footprint of the fabrication tool to which wafers are to be supplied. In a preferred embodiment the horizontal transfer mechanism comprises a bi-level conveyor comprised of a series of dual compartment segments. The dual compartment segments are coupled such that they may shift between a neutral and a positive position while maintaining a continuous movement channel between the two vertical transfer mechanisms. In this manner a wafer carrier may be placed within a first compartment of a neutrally positioned segment for movement; to store the wafer carrier the segment is shifted to the positive position. Thus a continuous movement channel comprised of the first or second compartments of a plurality of segments is maintained. The horizontal movement channel of a number of apparati may be interconnected to provide a local interconnection of fabrication tools.

14 Claims, 7 Drawing Sheets

FACTORY AUTOMATION APPARATUS AND METHOD FOR HANDLING, MOVING AND STORING SEMICONDUCTOR WAFER CARRIERS

FIELD OF THE INVENTION

The present invention relates generally to semiconductor wafer fabrication systems, and to an improved apparatus and method for handling, moving and storing semiconductor wafer carriers at a given semiconductor wafer fabrication tool, or within a collection of semiconductor wafer fabrication tools.

CROSS-REFERENCE TO RELATED APPLICATIONS

The present application is related to commonly assigned application Ser. No. 08/763,596, filed Dec. 11, 1996, entitled "Compact Apparatus and Method for Storing and Loading Semiconductor Wafer Carriers" by Dan Marohl (AMI Docket No. 1573), the entire summary, drawings and description thereof are incorporated herein by reference.

BACKGROUND

The drive for reduced cost per unit wafer processed characterizes the semiconductor industry. The semiconductor industry continuously searches for ways to increase wafer output and/or reduce overall equipment costs (costs of ownership) and production cycle time. Among the factors significantly affecting cost of ownership for a given piece of equipment are clean room costs, footprint, labor costs, and equipment throughput and utilization. It is well recognized that overall semiconductor wafer fabrication tool ("fabrication tool") productivity increases and cycle time reductions are achieved by ensuring a continuous supply of wafers at each fabrication tool. Wafers are transported in the factory in wafer carriers comprising either open cassettes or closed pods of various types. The desire for smaller lot sizes increases the number of wafer carriers circulating in a factory and requires increasing the transaction capability of the factory material handling system.

Conventionally a continuous supply of wafers has been accomplished by employing a local buffer supply (i.e., a supply of wafers at the fabrication tool). Examples of prior art local buffer supplies are manual storage shelves; the "FABS" unit marketed by Applied Materials which comprises a horizontally arranged series of four wafer carriers located in front of a fabrication tool's load lock chamber; and the "MINI BUFFER" marketed by Jenoptik/Infab, Inc. which comprises a vertical buffer positioned next to a fabrication tool's load lock chambers. The Infab MINI BUFFER comprises a series of vertically arranged shelves and one or more adjacent load ports for access by the tool's loader robot, and/or for access by factory transport agents. Conventionally one MINI BUFFER is positioned adjacent to each load lock. The loader robot may then access either MINI BUFFER to obtain a wafer carrier for loading to either load lock.

Although such methods maintain a continuous local buffer supply of wafer carriers, they occupy a considerable amount of floor space, thus increasing the system's overall size and cost of ownership. The fact that fabrication tools are frequently maintained in a clean room environment further exacerbates the increased cost associated with the system's larger footprint. In addition, most prior art systems do not allow simultaneous access by the tool loader and the factory transport agent, and thereby complicate factory transport scheduling. To provide fault tolerance and to enhance continuous flow manufacturing, fabrication tools which perform the same process (or related processes) are often arranged in a collection, yet mechanisms for interconnection of theses collections is seldom provided.

A related, commonly-assigned U.S. patent application Ser. No. 08/763,596, filed Dec. 11, 1996, discloses a Compact Apparatus and Method for Storing and Loading Semiconductor Wafer Carriers. U.S. patent application Ser. No. 08/763,596 provides an apparatus which provides substantial footprint reductions over conventional systems, and which advantageously allows for independent operation of the factory transport agent (i.e., the mechanism that transfers wafers from the factory to the load buffer apparatus' factory load port) and the fabrication tool's loader mechanism, and for local interconnection of fabrication tools. However, a need exists for an apparatus and method which provides these advantages and which is easily retrofitable to standard fabrication tools in use in the industry.

SUMMARY OF THE PREFERRED EMBODIMENTS

The present invention provides an apparatus and method for buffering wafer carriers to be loaded to a fabrication tool and for presenting the wafers to the fabrication tool for loading into load locks by a suitable wafer handler (i.e., a load buffer) which can easily be coupled to existing fabrication tools. In one aspect, the present invention actuates the opening device of closed pods, such as SMIF or other types of pods in order to present wafers to the fabrication tool. The load buffer of the present invention features 1) two physically separate load ports; a first load port for transferring wafer carriers between the factory and the load buffer apparatus, and a second load port for transferring wafers between the load buffer apparatus and the fabrication tool (these load ports can in fact be used interchangeably); and 2) one or more overhead storage and movement channels which, preferably, can extend to couple a plurality of fabrication tools, thereby providing local interconnection. The physical separation of the load ports allows for independent loading of both the load buffer apparatus and the fabrication tool. A factory transport agent therefore operates independent of the operation of the fabrication tool's loader mechanism. Thus, factory wide automation is made more flexible and efficient because synchronization between the factory transport agent and the fabrication tool's loader mechanism is not required. Further, local interconnection of fabrication tools allows for improved management of work in progress.

Because the overhead storage and movement channels are located above the fabrication tool, the fabrication tool is provided with a continuous buffer supply of wafer carriers in a reduced footprint configuration. Specifically, the inventive load buffer apparatus comprises: a first load port; a first vertical transfer mechanism, operatively coupling the first load port, for elevating a wafer carrier to a height greater than that of the fabrication tool; a horizontal transfer mechanism located above the fabrication tool and operatively coupling the first vertical transfer mechanism; a second vertical transfer mechanism, operatively coupling the horizontal transfer mechanism, for lowering the wafer carrier; and a second load port, operatively coupling the second vertical transfer mechanism. Operatively this sequence can be described as follows: from factory to load port then up, over and down to tool load port. In one aspect each vertical transfer mechanism can operatively couple a first and second overhead load port, respectively, so as to allow optional loading of wafer carriers from an overhead wafer carrier transport system. (As used herein the phrase "operatively coupling" means configured such that a wafer carrier can be transferred between the identified components.)

In a preferred embodiment the horizontal transfer mechanism comprises a modular bi-level conveyor comprised of a plurality of dual-compartment segments. Each dual-compartment segment is coupled to an actuator that comprises a shifting mechanism which shifts the respective conveyor segment between two positions, a neutral (empty) position and a positive (occupied) position. The combination of positions guarantees that there will always be an open movement channel. The load buffer thus provides both movement and storage.

Preferably, each dual-compartment segment of the bi-level conveyor is initially neutrally positioned. A wafer carrier is loaded to a first vertical transfer portion through a first load port and elevated to the bi-level conveyor. Thereafter the wafer carrier is transferred from the first vertical transfer portion to the bi-level conveyor by conventional methods. A given dual-compartment segment may place a wafer carrier in storage at any compartment along the length of the bi-level conveyor (without obstructing the movement of wafer carriers through the bi-level conveyor) by shifting from the neutral position to the positive position. In this manner the space located above a fabrication tool may be advantageously used for storage and movement of wafer carriers. As well, in addition to extending between the first and second vertical transfer mechanisms, the horizontal transfer mechanism can extend beyond the first and/or the second vertical transfer mechanism, thereby providing additional storage locations and allowing for the local interconnection of fabrication tools. The configuration of the present invention provides greater flexibility and enhances the overall factory efficiency by allowing independent loading of the factory load port and the tool load port, and provides the option of significantly more storage locations than provided by prior art systems.

Other objects, features and advantages of the present invention will become more fully apparent from the following detailed description of the preferred embodiments, the appended claims and the accompanying drawings.

BRIEF DESCRIPTION OF THE DRAWINGS

FIGS. 2A and 2B depict segments of a preferred horizontal transfer mechanism employed in the load buffer of the present invention;

DETAILED DESCRIPTION OF THE DRAWINGS

Figure 1A:
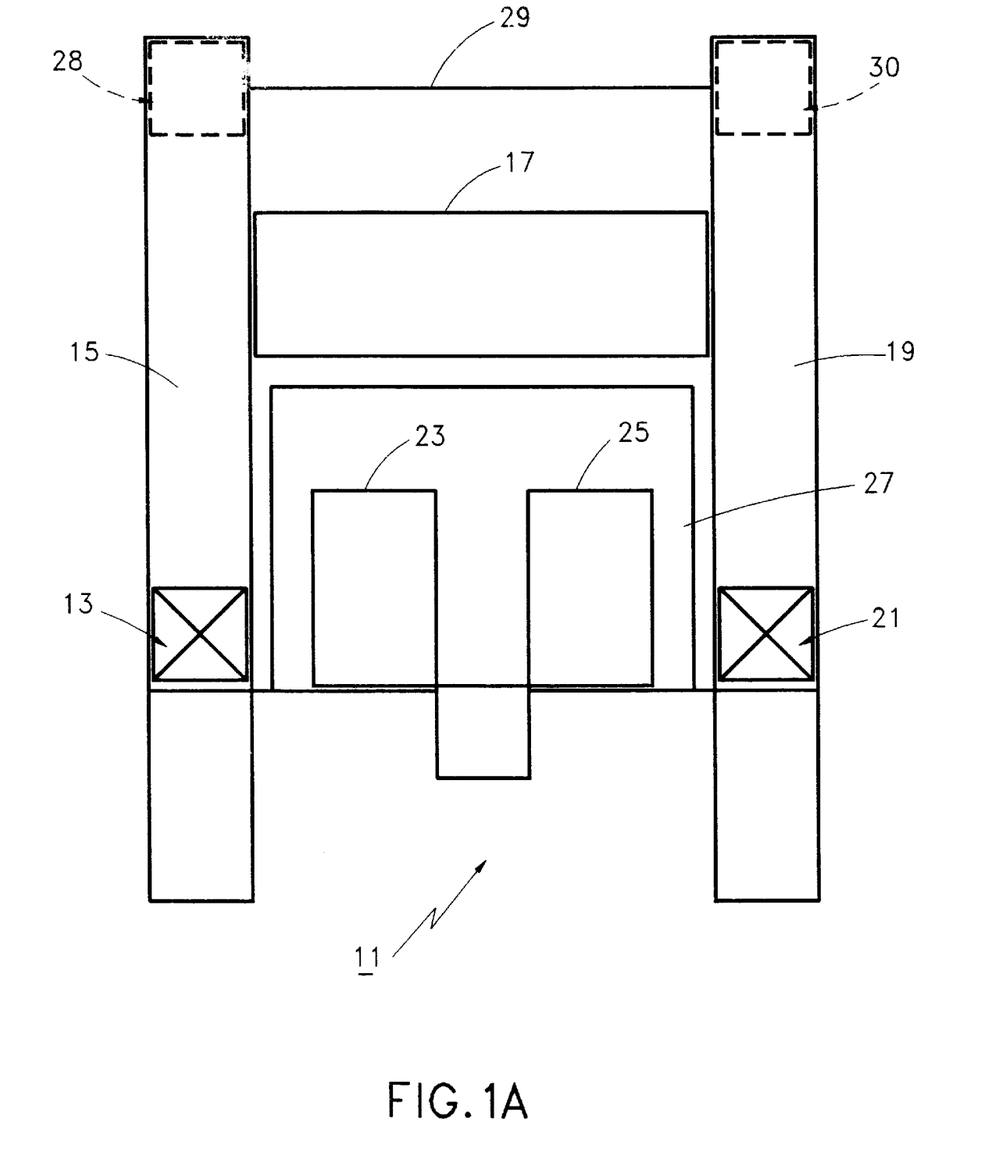
FIG. 1A is a side elevation view of a preferred embodiment of an inventive load buffer wherein the load ports are contiguous with the vertical transfer mechanisms.
Figure 1B:
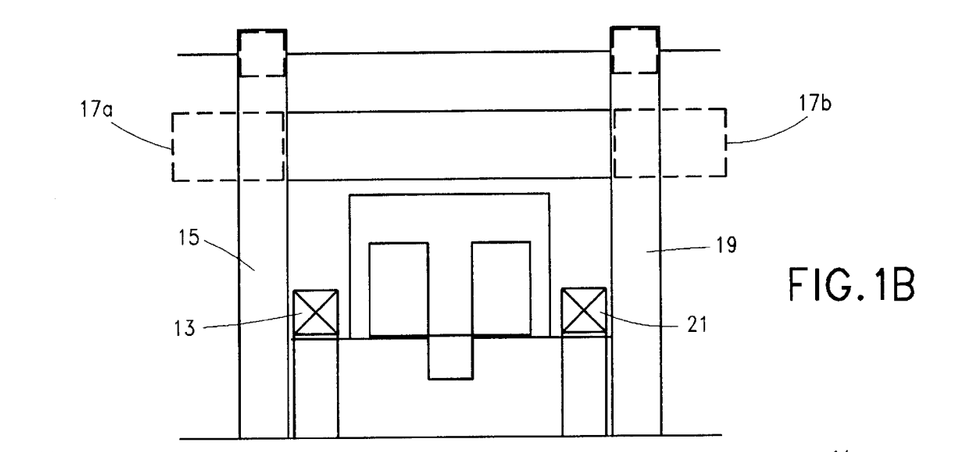
FIG. 1B is a side elevation view of a preferred embodiment of an inventive load buffer wherein the load ports are adjacent the vertical transfer mechanisms.
Figure 1C:
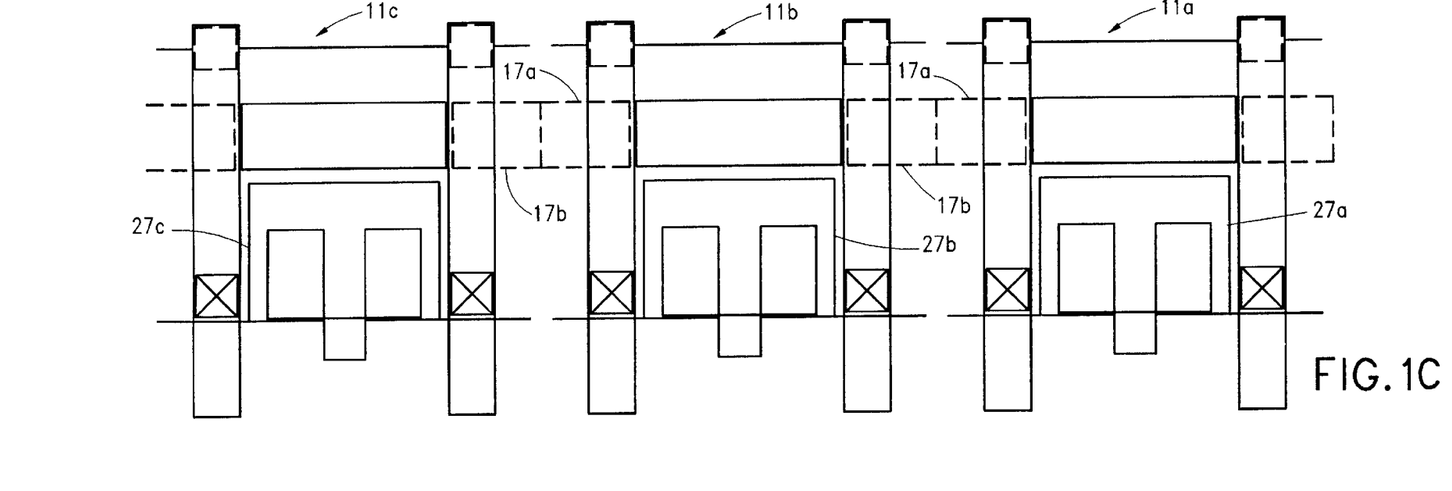
FIG. 1C is a side elevational view of a local interconnection of fabrication tools.
Figure 3:
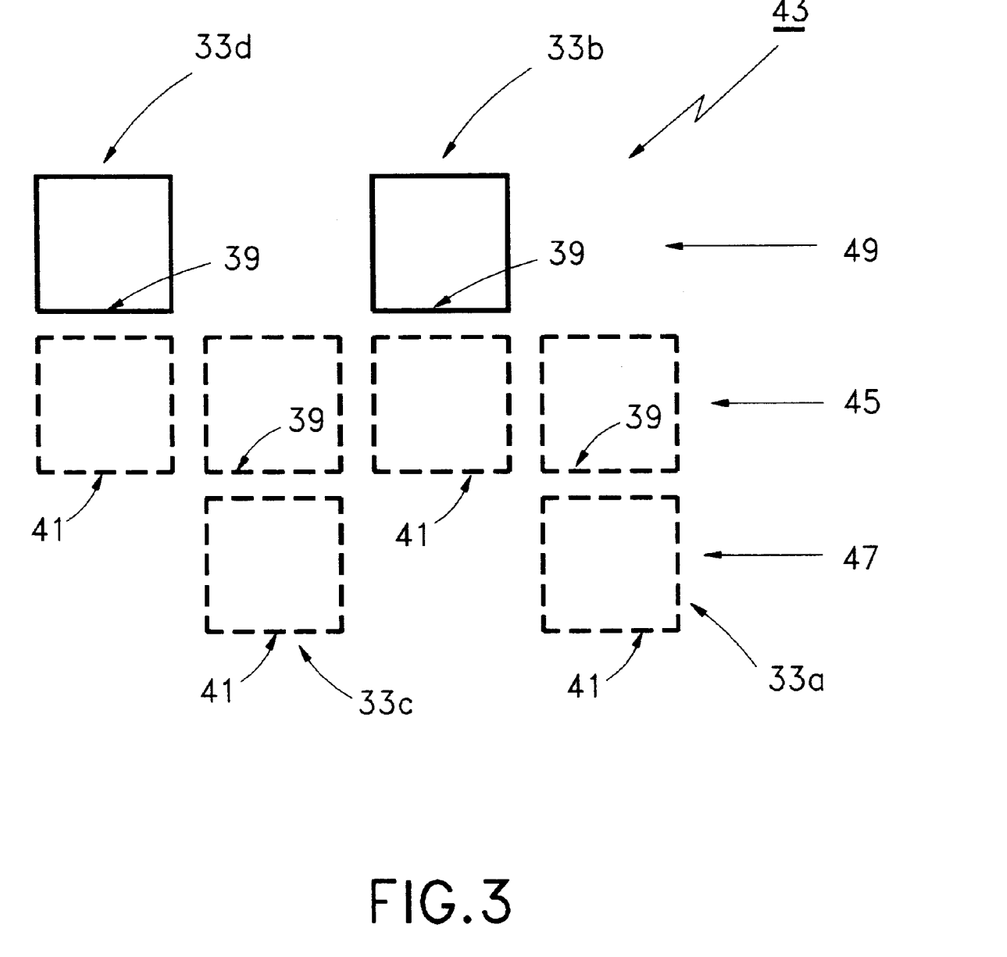
FIG. 3 is a side elevational view of a bi-level conveyor comprised of a plurality of the dual-compartment segments of FIG. 2A.

FIG. 1A is a side elevation view of a preferred embodiment of an inventive load buffer 11, wherein the load ports are contiguous with the vertical transfer mechanisms. As shown in FIG. 1 the load buffer 11 comprises a first load port 13. In the configuration shown, the first load port 13 is a port for loading wafer carriers from the factory. The first load port 13 is operatively coupled to a first elevator 15 which receives wafer carriers from the factory through the first load port 13. The upper portion of the first elevator 15 is operatively coupled to one end of a horizontal transfer mechanism 17, and the other end of the horizontal transfer mechanism 17 is operatively coupled to the upper portion of a second elevator 19. A lower portion of the second elevator 19 operatively couples a second load port 21. In the configuration shown, the second load port 21 is a port for loading wafer carriers from the load buffer 11 into either a first load lock 23 or a second load lock 25 of a fabrication tool 27. In the most preferred embodiment, the first load port 13 is a predetermined location which the first elevator 15 occupies when it is in its lowest position, and the second load port 21 is a predetermined location which the second elevator 19 occupies when it is in its lowest position. The inventive load buffer 11 shown in FIG. 3 is configured such that the first elevator 15 and the second elevator 19 extend to a height greater than that of the fabrication tool 27 and such that the horizontal transfer mechanism 17 is located above (i.e., at least partially overlapping) the footprint of the fabrication tool 27. Preferably the horizontal transfer mechanism 17 is substantially above, and most preferably completely above the footprint of the fabrication tool 27. Thus, the load buffer 11 of the present invention provides wafer storage and movement within a minimized footprint. Further, the first elevator 15 and/or the second elevator 19 may operatively couple a wafer carrier transport system. The first elevator 15 and the second elevator 19 of FIG. 1A are shown operatively coupling an overhead wafer carrier transport system 29 via a first overhead load port 28 and a second overhead load port 30, respectively. In the most preferred embodiment, the first overhead load port 28 is a predetermined location which the first elevator 15 occupies when it is in its highest position, and the second overhead load port 30 is a predetermined location which the second elevator 19 occupies when it is in its highest position. As shown in FIG. 1B, the horizontal transfer mechanism may have an extended portion 17a, 17b which respectively extends beyond the first vertical transfer mechanism 15 and/or the second vertical transfer mechanism 21. The extended portions 17a, 17b provide additional storage locations, and can be coupled to the horizontal transfer mechanism 17 (or to the extended portions 17a, 17b) of another fabrication tool to provide a local interconnection of fabrication tools (see FIG. 1C).

In operation an automated local area fabrication system; comprising the load buffer 11, at least the first load lock 23, and at least one processing chamber; receives a wafer carrier in the first load port 13. Typically the wafer carrier will be traveling from a previous process location (e.g., an additional automated local area fabrication system) and may be transported to and loaded into the first load port 13 via a factory automation system, an automatic guided vehicle, or an operator, etc. The wafer carrier is loaded via the first load port 13 into the first elevator 15. The first elevator 15 elevates the wafer carrier to the upper portion of the first elevator 15 which is connected to the horizontal transfer mechanism 17. Thereafter the wafer carrier is transferred to the horizontal transfer mechanism 17 via conventional methods, for example, the first elevator 15 may comprise an x-y robot that delivers a wafer carrier to the horizontal transfer mechanism 17 and then return to the first load port 13, or, the first elevator 15 may comprise a surface of rolling elements which are actuated when the surface is aligned with the horizontal transfer mechanism 17, causing the wafer carrier to be transferred across the rolling elements to the horizontal transfer mechanism 17.

After traveling though the horizontal transfer mechanism 17 the wafer carrier is transferred from the horizontal transfer mechanism 17 to the upper portion of the second elevator 19 via conventional methods. The second elevator 19 then lowers the wafer carrier to the second load port 21 where a conventional loader mechanism 31 (e.g., a robot) transfers one or more wafers, or the entire wafer carrier from the second load port 21 to either the first load lock 23 or a second load lock 25 of the fabrication tool 27. Within the fabrication tool 27 wafers are transferred from the first load lock 23 or the second load lock 25 to one or more process chambers 26 (see FIG. 5) for processing. Alternatively, the first elevator 15 and/or the second elevator 19 may transfer a wafer carrier to the overhead factory transfer system 29 via the first overhead load port 28 or the second overhead load port 30.

FIG. 1B is a side elevation view of a preferred embodiment of an inventive load buffer wherein the first load port 13 is adjacent the first vertical transfer mechanism 15, and the second load port 21 is adjacent the second vertical transfer mechanism 19. Each load port is coupled to the respective vertical transfer mechanism via conventional methods (e.g., a pick and place robot, a plurality of rolling elements, etc.) which transfer a wafer carrier between the respective load port and the vertical transfer mechanism. This type of adjacent configuration could be used to retrofit existing fabrication tools with the load buffer of the present invention. Except for the positioning of the load ports and the vertical transfer mechanisms, the load buffer of FIG. 1B is configured and operates the same as that of FIG. 1A.

FIG. 1C is a side elevational view of a local interconnection of fabrication tools. As shown in FIG. 1C, a plurality of fabrication tools 27a, 27b, 27c are interconnected via the horizontal transfer mechanisms 17a, 17b, of load buffers 11a, 11b, 11c. Specifically, the extended portion 17a of the load buffer 11a is coupled to the extended portion 17b of the load buffer 11b, and the extended portion 17a of the load buffer 11b is coupled to the extended portion 17b of the load buffer 11c. In this configuration, a wafer carrier may advantageously travel directly between the interconnected load buffers, without the aid of the overhead wafer carrier transport system, an AGV or operator. Such local interconnection of fabrication tools increases the flexibility and the transaction capability of the factory material handling system.

Figure 2A:
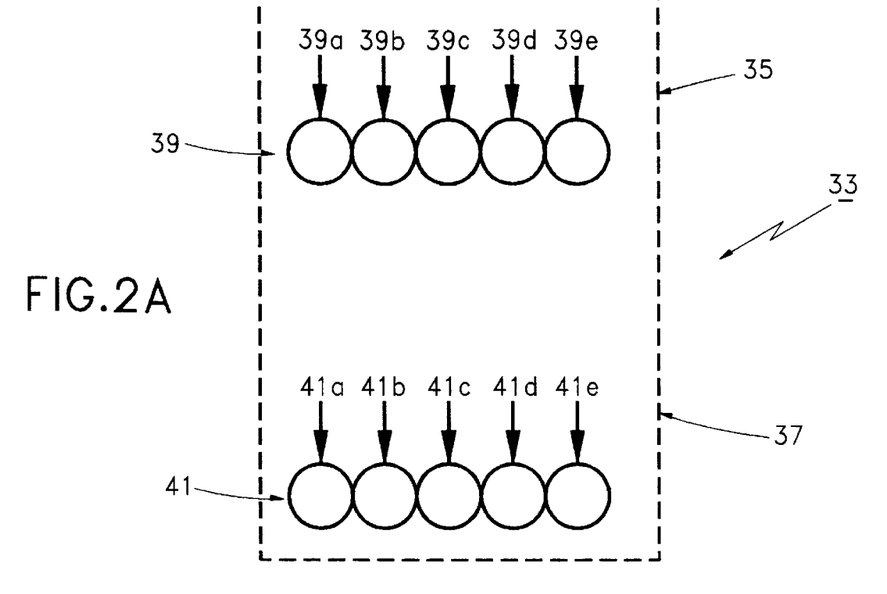
FIG. 2A is a side elevational view of a vertically oriented dual-compartment segment of a preferred modular conveyor employed in a first aspect of the inventive load buffer.
Figure 2B:
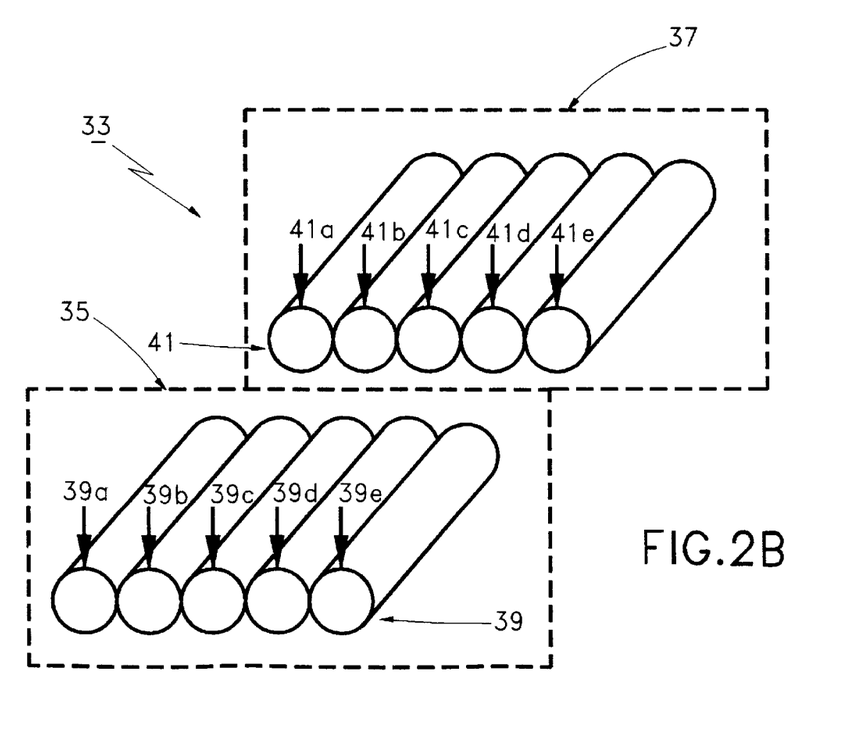
FIG. 2B is a side perspective view of a horizontally oriented dual-compartment segment of a preferred modular conveyor employed in a second aspect of the inventive load buffer of the present invention.

FIGS. 2A and 2B depict individual segments of a preferred horizontal transfer mechanism. FIG. 2A is a side view of a dual-compartment segment 33 of a preferred modular conveyor employed in a first aspect of the inventive load buffer. The conveyor segment 33 comprises a first compartment 35 and a second compartment 37, respectively having a first surface 39 comprised of a plurality of rolling elements 39a–e and a second surface 41 comprised of a plurality of rolling elements 41a–e. In a preferred embodiment a plurality of the conveyor segments 33 of FIG. 2A are operatively coupled to form a modular bi-level conveyor 43 (see FIGS. 3 and 4). Any number of dual-compartment segments 33 may be coupled together so as to form a bi-level conveyor 43 of a desired length. The bi-level structure guarantees an open movement channel, and can be constructed by joining levels of conventional rolling element type conveyors such as those manufactured by Middlesex General Industries, Inc. of Woburn, Mass. and described in U.S. Pat. No. 4,793,262, entitled "Transport System For Computer Integrated Manufacturing/Storage And Drive Component Therefore," the entirety of which is incorporated herein by reference.

FIG. 2B is a side perspective view of an alternative horizontally oriented dual-compartment segment 33 of a preferred modular conveyor employed in the second aspect of the inventive load buffer. Like the conveyor segment 33 of FIG. 2A, the conveyor segment 33 of FIG. 2B comprises the first compartment 35 and the second compartment 37 respectively having the first surface 39 comprised of the plurality of rolling elements 39a–e and the second surface 41 comprised of the plurality of rolling elements 41a–e. In a preferred embodiment a plurality of the conveyor segments 33 of FIG. 2B are operatively coupled to form a modular bi-level conveyor 43 (see FIGS. 3 and 5). Any number of dual-compartment segments 33 may be coupled together so as to form a bi-level conveyor 43 of a desired length.

FIG. 3 is a side elevational view of a bi-level conveyor 43 comprised of a plurality of the dual-compartment segments 33 of FIG. 2A, wherein the dual-compartment segments 33a–d are vertically oriented and coupled together to provide a storage and movement channel. FIG. 3 is useful for describing two positions (a neutral position and a positive position) each dual-compartment segment 33 may assume. In FIG. 3, dual-compartment segment 33a and dual-compartment segment 33c are shown in the neutral position, and dual-compartment segment 33b and dual-compartment segment 33d are shown in the positive position. Three channels are defined by the two possible positions of the dual-compartment segments 33a–d; a move channel 45, a shuttle channel 47 and a storage channel 49. In the neutral position the first compartment 35 of the dual-compartment segment 33 occupies the move channel 45, and the second compartment 37 of the dual-compartment segment 33 occupies the shuttle channel 47. In the positive position the first compartment 35 of the dual-compartment segment 33 occupies the storage channel 49 and the second compartment 37 of the dual-compartment segment 33 occupies the move channel 45. Thus, although a given dual-compartment segment 33 may be positioned such that a compartment occupies either the shuttle channel 47 or the storage channel 49, each dual-compartment segment 33 has a compartment which occupies the move channel 45. Therefore the move channel 45 is a continuous channel, formed of the first compartment 35 and/or the second compartment 37 of a plurality of the dual-compartment segments 33, through which wafer carriers may travel; and the shuttle channel 47 and the storage channel 49 are intermittently occupied by the second compartment 37 or the first compartment 35, respectively, of one or more dual-compartment segments 33. Thus, the shuttle channel 47 and/or the storage channel 49 may store wafer carriers without blocking the passage of wafer carriers through the move channel 45.

In the preferred operation, initially each dual-compartment segment 33a–d is neutrally positioned. A first wafer carrier (not shown) is then loaded into the first compartment 35 of dual-compartment segment 33a and can: 1) travel immediately along the move channel 45 to the end of the bi-level conveyor 43 where the first wafer carrier will be unloaded from the bi-level conveyor 43; 2) travel a distance along the bi-level conveyor 43 (e.g., to dual-compartment segment 33b, 33c or 33d) and then be placed in storage (e.g., placed in the storage channel 49 by shifting the respective dual-compartment segment 33 to a positive position); or 3) immediately be placed in storage (e.g., by shifting dual-compartment segment 33a to a positive position). To remove a wafer carrier from storage and return the wafer carrier to the move channel 45, the dual-compartment segment 33 containing the wafer carrier is shifted from the positive position to the neutral position. Thereafter, the wafer carrier may continue traveling along the move channel 45. Thus, by employing a bi-level conveyor 43 and by designating one channel for storage and one channel for movement, a first wafer carrier may be placed in storage at any point along the bi-level conveyor 43 (i.e., within any of the plurality of dual-compartment segments 33a–d) without obstructing the passage of a second wafer carrier through the move channel 45. Although the move channel 45 is preferably used only for moving wafer carriers, and the storage channel 49 is preferably used only for storing wafer carriers, the storage channel 49 and/or the move channel 45 may perform a combination of storage and movement functions.

Figure 4:
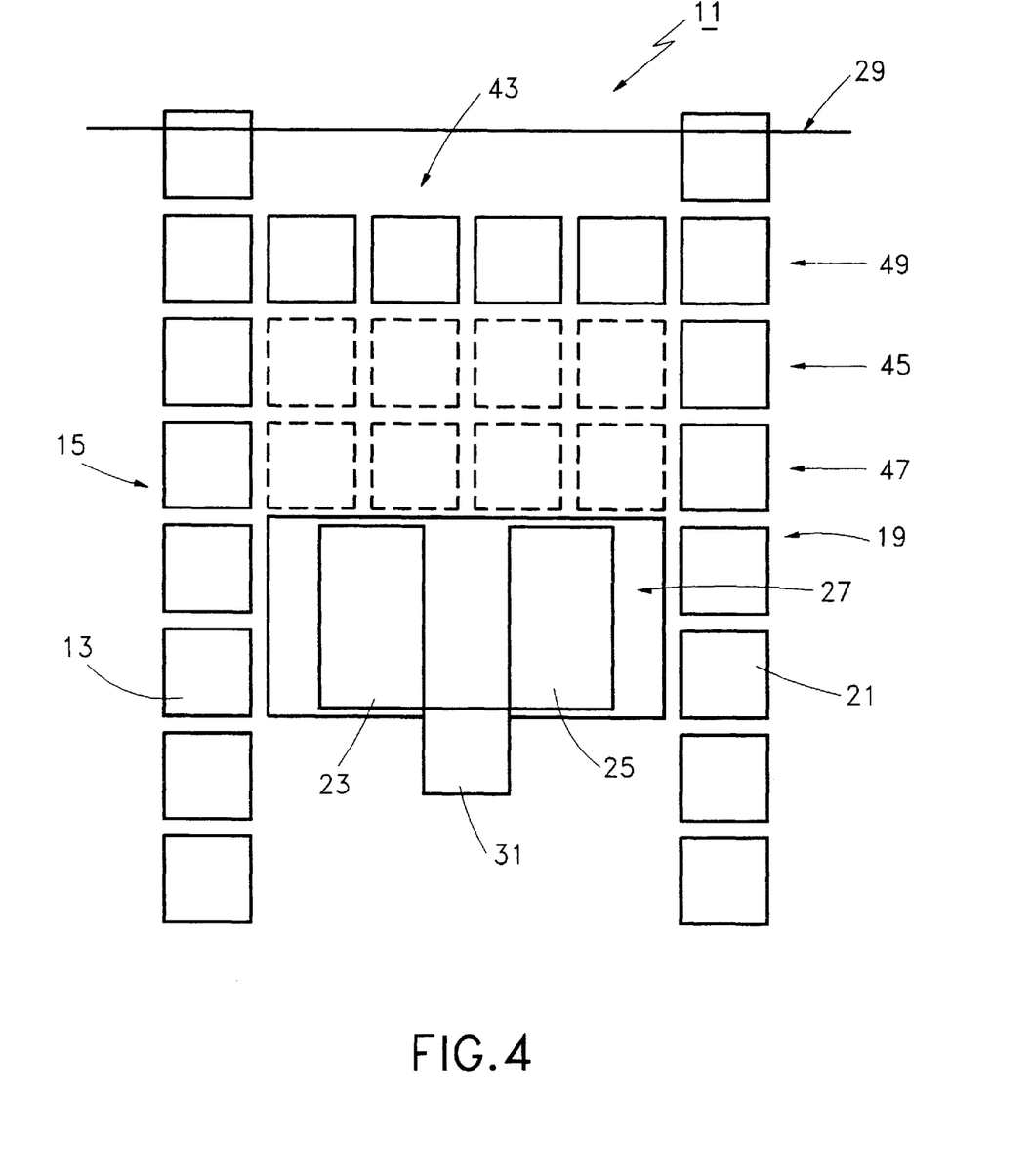
FIG. 4 is a side elevation view of a preferred embodiment of the inventive load buffer wherein the transfer mechanism comprises the bi-level conveyor of FIG. 3.

FIG. 4 is a side elevation view of a preferred embodiment of an inventive load buffer 11 wherein the horizontal transfer mechanism 17 comprises the bi-level conveyor 43 of FIG. 3. The overall configuration of the load buffer 11 and the bi-level conveyor 43 are described with reference to FIGS. 1 and 3, respectively, and are therefore not repeated here. The operation of the load buffer of FIG. 3 is described below.

In operation an automated local area fabrication system; comprising the load buffer 11, at least the first load lock 23, and at least one processing chamber; receives a wafer carrier in the first load port 13. Typically the wafer carrier will be traveling from a previous process location (e.g., an additional automated local area fabrication system) and maybe transported to and loaded into the first load port 13 via, for example, a factory automation system, an automatic guided vehicle, or an operator. The wafer carrier is loaded via the first load port 13 into the first elevator 15. The first elevator 15 elevates the wafer carrier to the upper portion of the first elevator 15 which is connected to the bi-level conveyor 43. Thereafter the wafer carrier is transferred to the bi-level conveyor 43 via conventional methods. An actuator (not shown) controls the bi-level conveyor 43 causing a given dual-compartment segment 33 to shift from the neutral position to the positive position and vice versa. The actuator also controls the operation of the first plurality of rolling elements 39a–e, and the second plurality of rolling elements 41a–e, selectively causing them to rotate and thus to transfer a wafer carrier from one universe of rolling elements to the next. By selectively shifting the dual-compartment segments 33a–d and rotating the plurality of rolling elements 39a–e and 41a–e, wafer carriers are stored in the storage channel 49 and transferred through the move channel 45, as described previously in conjunction with FIG. 3.

After traveling though the bi-level conveyor 43 the wafer carrier is transferred from the bi-level conveyor 43 to the upper portion of the second elevator 19 via conventional methods. The second elevator 19 then lowers the wafer carrier to the second load port 21 where a conventional loader mechanism 31 (e.g., a robot) transfers one or more wafers at a time, or transfers the entire wafer carrier, from the second load port 21 to either the first load lock 23 or the second load lock 25 of the fabrication tool 27. Within the fabrication tool 27 wafers are transferred from the first load lock 23 or the second load lock 25 to one or more process chambers 26 (see FIG. 5) for processing. Alternatively, the first elevator 15 and/or the second elevator 19 may transfer a wafer carrier to the overhead factory transfer system 29, and/or the bi-level conveyor 43 may transfer a wafer carrier directly to the load buffer of a locally connected fabrication tool.

Figure 5:
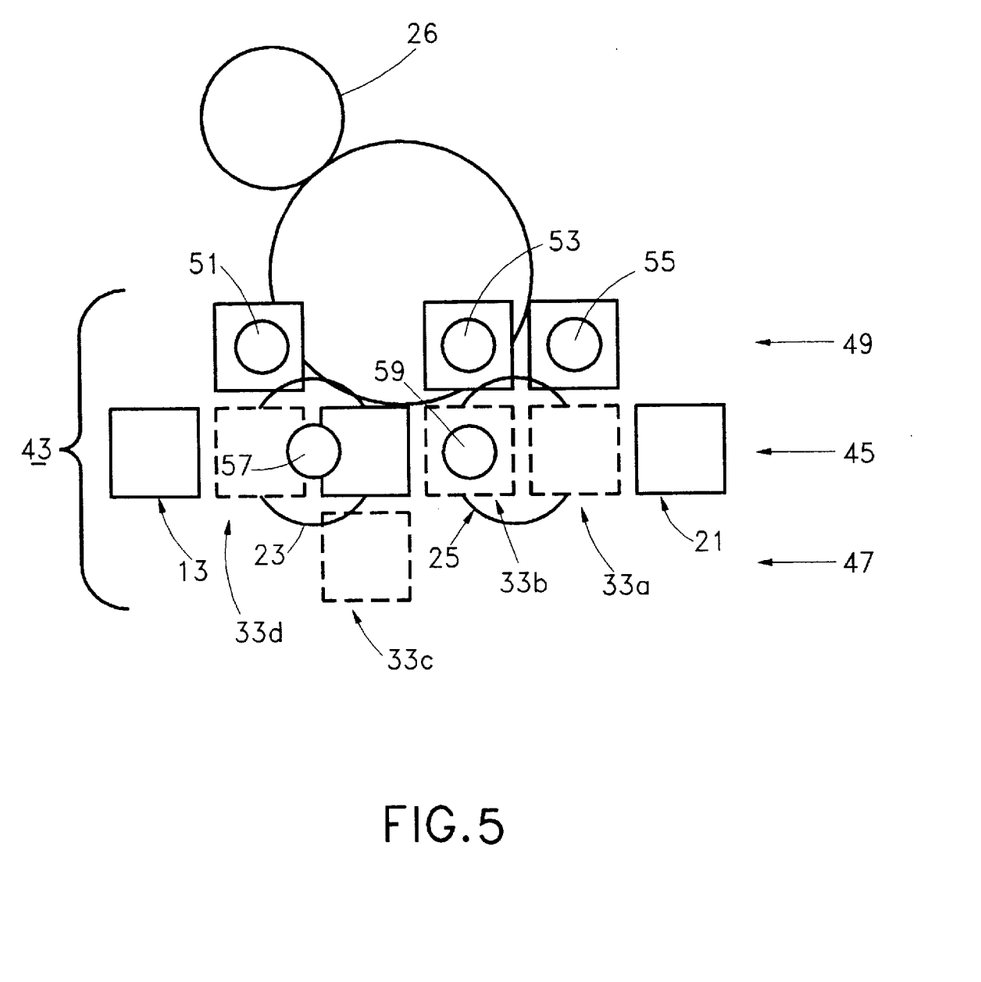
FIG. 5 is a top plan view of the second aspect of the inventive load buffer 11, which employs the horizontally oriented dual-compartment segment of FIG. 2B.

FIG. 5 is a top plan view of a second aspect of the inventive load buffer 11, which employs the horizontally oriented dual-compartment segment 33 of FIG. 2B. As shown in FIG. 5 the dual-compartment segment 33c is neutrally positioned (i.e., the first compartment 35 occupies the move channel 45 and the second compartment 37 occupies the shuttle channel 47) and the dual-compartment segments 33a, 33b and 33d are positively positioned (i.e., with the first compartment 35 occupying the storage channel 49 and the second compartment 37 occupying the shuttle channel 47). In the example of FIG. 5 a first wafer carrier 51 is stored by dual-compartment segment 33d, a second wafer carrier 53 is stored by dual-compartment segment 33b, and a third wafer carrier 55 is stored by dual-compartment segment 33a. A fourth wafer carrier 57 and a fifth wafer carrier 59 are moving through the move channel 45. The fourth wafer carrier 57 is moving from the first compartment 35 of the dual-compartment segment 33c to the first compartment 35 of the dual-compartment segment 33d, and the fifth wafer carrier 59 is moving through the first compartment 35 of the dual-compartment segment 33b. As this example shows, a single dual-compartment segment 33 may contain wafer carriers in both the first compartment 35 and in the second compartment 37 at any given time, as does dual-compartment segment 33b. Also as this example shows, at any given time the move channel 45 may comprise either the first compartment 35 or the second compartment 37 of a given dual-compartment segment 33.

As with the vertically oriented bi-level conveyor 43 of FIG. 3, in the preferred operation of FIG. 5, each dual-compartment segment 33 is initially neutrally positioned, a first wafer carrier is then loaded into the first compartment 35 of the dual-compartment segment 33a and can: 1) travel immediately along the move channel 45 to the end of the bi-level conveyor 43 where the first wafer carrier will be unloaded from the bi-level conveyor 43 and placed within the second elevator 19 (see FIG. 6); 2) travel a distance along the bi-level conveyor 43 (e.g., to dual-compartment segment 33b, 33c or 33d) and then be placed in storage (e.g., placed in the storage channel 49 by shifting the respective dual-compartment segment 33 to a positive position); or 3) immediately be placed in storage (e.g., by shifting dual-compartment segment 33a to a positive position). To remove a wafer carrier from storage and return it to the move channel 45, the dual-compartment segment 33 containing the wafer carrier is shifted from the positive position the neutral position. Thereafter, the wafer carrier may continue traveling along the move channel 45. Thus, by employing a dual-compartment conveyor 43 and by designating one channel for storage and one channel for movement, a first wafer carrier may be placed in storage at any point along the bi-level conveyor 43 (i.e., within any of the plurality of dual-compartment segments 33a–d) without obstructing the passage of a second wafer carrier through the move channel 45. Although the move channel 45 is preferably used only for moving wafer carriers, and the storage channel 49 is preferably used only for storing wafer carriers, the storage channel 49 and/or the move channel 45 may perform a combination of storage and movement functions.

Figure 6:
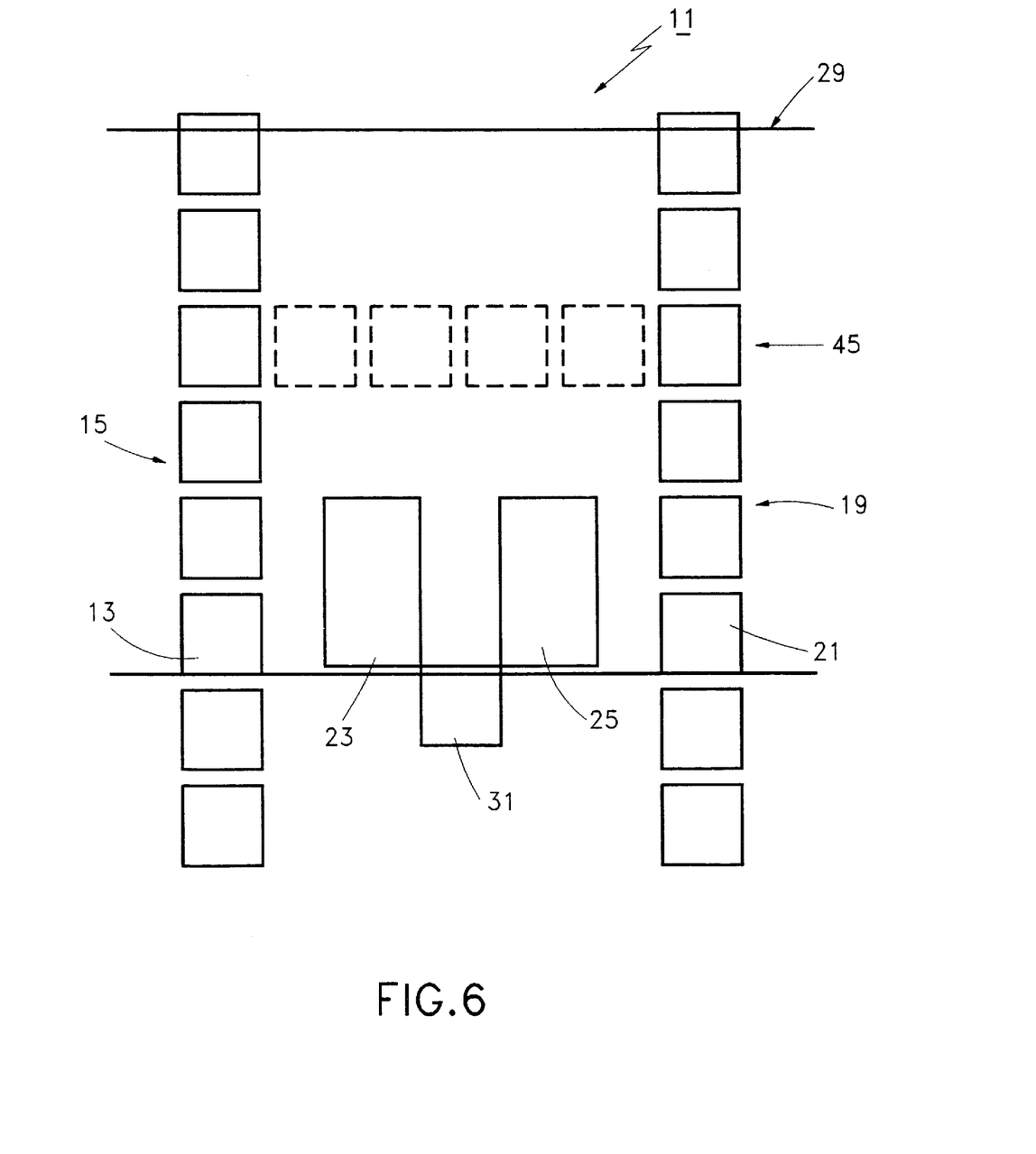
FIG. 6 is a side elevational view of the second aspect of the inventive load buffer, taken along line 1—1 of FIG. 5.

FIG. 6 is a side elevational view of the second aspect of the inventive load buffer 11, taken along line 1—1 of FIG. 5. Thus, while FIG. 6 shows only the move channel 45—the shuttle channel 47 and the storage channel 49 are in the plane perpendicular to the page. Except for the horizontal orientation of the bi-level conveyor 43 (described with reference to FIG. 5), the configuration and operation of the load buffer 11 shown in FIG. 6 is the same as that described with reference to FIG. 4, further description is therefore omitted.

The foregoing description discloses only the preferred embodiments of the invention, modifications of the above disclosed apparatus and method which fall within the scope of the invention will be readily apparent to those of ordinary skill in the art. For instance, although the dual-compartment segment 33 is shown as having only a first compartment 35 and a second compartment 37, the dual-compartment segment 33 may have additional compartments which could provide additional storage locations or additional movement channels. Although each dual-compartment segment 33 is shown as being wide enough to hold only a single wafer carrier, the size of dual-compartment segment 33 may vary. Further, in operation, any channel may perform both storage and movement at a given time, and the first and second load ports may each function as both a factory load port and a tool load port. The horizontal transfer mechanism is not limited to the conveyor system disclosed. Other equivalent transfer mechanisms will be apparent to those of ordinary skill in the art. Although a horizontal transfer mechanism that comprises both a storage and a move channel is preferred, the horizontal transfer mechanism may comprise a single channel. Preferably the first and second load ports will conform to the specifications set forth in SEMI-E15, however, other load ports could be used. Finally, although the load buffer apparatus is described as transferring wafer carriers, it should be understood that the invention is not limited thereto, and wafers may be transferred individually, and/or in SMIF or other type pods, etc. If used for transferring SMIF or other type pods the load buffer of the present invention preferably would include a mechanism for opening and closing the pod at the tool load port, such as those conventionally known in the art.

Accordingly, while the present invention has been disclosed in connection with the preferred embodiments thereof, it should be understood that other embodiments may fall within the spirit and scope of the invention, as defined by the following claims.

What is claimed is:

1. An apparatus for buffering wafer carriers to be loaded to a fabrication tool comprising:
    a first load port adapted to receive a wafer carrier;
    a first vertical transfer mechanism disposed to elevate the wafer carrier from the first load port to a height greater than that of the fabrication tool;
    a horizontal transfer mechanism operatively coupled to said first vertical transfer mechanism at a location above the fabrication tool, and adapted to transfer the wafer carrier from a first side of the fabrication tool to a second side of the fabrication tool;
    a second vertical transfer mechanism operatively coupled to said horizontal transfer mechanism at a location above the fabrication tool and adapted to lower the wafer carrier from said horizontal transfer mechanism to a position for loading into the fabrication tool; and
    a second load port disposed to receive the wafer carrier from said second vertical transfer mechanism;
    wherein said horizontal transfer mechanism defines a path between said first vertical transfer mechanism and said second vertical transfer mechanism.

2. The apparatus of claim 1 wherein at least one of said first load port and said second load port comprises an E15 load port.

3. The apparatus of claim 1 wherein at least one of said first vertical transfer mechanism and said second vertical transfer mechanism is operatively coupled to an overhead load port.

4. The apparatus of claim 1 wherein the horizontal transfer mechanism comprises at least one extended portion adapted to connect to a remote apparatus for buffering wafer carriers to be loaded to a remote fabrication tool.

5. The apparatus of claim 1 wherein the first vertical transfer mechanism comprises an elevator, the second vertical transfer mechanism comprises an elevator, and the horizontal transfer mechanism comprises a conveyor.

6. The apparatus of claim 5 wherein the horizontal transfer mechanism comprises a bi-level conveyor having a first compartment and a second compartment.

7. The apparatus of claim 6 wherein the first and second compartments comprise a plurality of rolling mechanisms.

8. The apparatus of claim 6 wherein the horizontal transfer mechanism is configured so as to form a first region for moving the wafer carriers, a second region for shuttling empty conveyor compartments, and a third region for storing the wafer carriers.

9. The apparatus of claim 8 wherein the first region, the second region and the third region are vertically oriented.

10. The apparatus of claim 8 wherein the first region, the second region and the third region are horizontally oriented.

11. An automated local area semiconductor wafer fabrication system for automatically storing, loading and processing semiconductor wafers, comprising:
    a fabrication tool having at least a first load lock; a transfer chamber operatively coupled to said first load lock; and at least one process chamber operatively coupled to said transfer chamber; and
    an apparatus adapted to buffer wafer carriers to be loaded to the fabrication tool, said apparatus operatively coupled to said first load lock and comprising:
    a first load port adapted to receive a wafer carrier;
    a first vertical transfer mechanism disposed to elevate the wafer carrier from the first load port to a height greater than that of the fabrication tool;
    a horizontal transfer mechanism operatively coupled to said first vertical transfer mechanism at a location above the fabrication tool, and adapted to transfer the wafer carrier from a first side of the fabrication tool to a second side of the fabrication tool;
    a second vertical transfer mechanism operatively coupled to said horizontal transfer mechanism at a location above the fabrication tool and adapted to lower the wafer carrier from said horizontal transfer mechanism to a position for loading into the fabrication tool; and
    a second load port disposed to receive the wafer carrier from said second vertical transfer mechanism;
    wherein said horizontal transfer mechanism defines a path between said first vertical transfer mechanism and said second vertical transfer mechanism.

12. A factory automation system comprising:

at least a first automated local area semiconductor wafer fabrication system comprising a fabrication tool comprising at least a first load lock; a transfer chamber operatively coupled to said first load lock; and at least one process chamber; and an apparatus adapted to buffer wafer carriers to be loaded to the fabrication tool, said apparatus operatively coupled to said first load lock and comprising:
 a first load port adapted to receive a wafer carrier;
 a first vertical transfer mechanism disposed to elevate the wafer carrier from the first load port to a height greater than that of the fabrication tool;
 a horizontal transfer mechanism operatively coupled to said first vertical transfer mechanism at a location above the fabrication tool, and adapted to transfer the wafer carrier from a first side of the fabrication tool to a second side of the fabrication tool;
 a second vertical transfer mechanism operatively coupled to said horizontal transfer mechanism at a location above the fabrication tool and adapted to lower the wafer carrier from said horizontal transfer mechanism to a position for loading into the fabrication tool; and
 a second load port disposed to receive the wafer carrier from said second vertical transfer mechanism;
 wherein said horizontal transfer mechanism defines a path between said first vertical transfer mechanism and said second vertical transfer mechanism.

13. The apparatus of claim 12 further comprising a factory transfer system adapted to operatively coupled said first automated local area semiconductor wafer processing system to a remote second fabrication tool, so as to automatically transfer wafer carriers between said first automated local area semiconductor wafer processing system and the remote second fabrication tool.

14. A local interconnection of fabrication tools comprising:

a first apparatus adapted to buffer wafer carriers to be loaded to a first fabrication tool comprising:
 a first load port adapted to receive a wafer carrier;
 a first vertical transfer mechanism disposed to elevate the wafer carrier to a height greater than that of the first fabrication tool;
 a first horizontal transfer mechanism operatively coupled to said first vertical transfer mechanism at a location above the first fabrication tool, and adapted to transfer the wafer carrier from a first side of the fabrication tool to a second side of the first fabrication tool;
 a second vertical transfer mechanism operatively coupled to said first horizontal transfer mechanism at a location above the first fabrication tool and adapted to lower the wafer carrier from said first horizontal transfer mechanism to a position for loading into the first fabrication tool; and
 a second load port disposed to receive the wafer carrier from said second vertical transfer mechanism; and
a second apparatus adapted to buffer wafer carriers to be loaded to a second fabrication tool comprising:
 a third load port adapted to receive a wafer carrier;
 a third vertical transfer mechanism disposed to elevate the wafer carrier from the third load port to a height greater than that of the second fabrication tool;
 a second horizontal transfer mechanism operatively coupled to said first vertical transfer mechanism at a location above the second fabrication tool, and adapted to transfer the wafer carrier from a first side of the second fabrication tool to a second side of the second fabrication tool;
 a fourth vertical transfer mechanism operatively coupled to said second horizontal transfer mechanism at a location above the second fabrication tool and adapted to lower the wafer carrier from said second horizontal transfer mechanism to a position for loading into the second fabrication tool;
 and a fourth load port disposed to receive the wafer carrier from said fourth vertical transfer mechanism;
wherein said first horizontal transfer mechanism and said second horizontal transfer mechanism are operatively coupled via said first horizontal transfer mechanism and said second horizontal transfer mechanism.

\* \* \* \* \*